United States Patent
Chen et al.

(10) Patent No.: US 9,247,814 B2
(45) Date of Patent: Feb. 2, 2016

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chun-Yi Ho, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 14/230,092

(22) Filed: Mar. 31, 2014

(65) Prior Publication Data

US 2015/0282374 A1 Oct. 1, 2015

(51) Int. Cl.
*A47B 88/10* (2006.01)
*A47B 88/14* (2006.01)

(52) U.S. Cl.
CPC .............. *A47B 88/10* (2013.01); *A47B 88/14* (2013.01); *A47B 2210/0035* (2013.01); *A47B 2210/0059* (2013.01)

(58) Field of Classification Search
CPC .......... A47B 88/10; A47B 2210/0032; A47B 2210/0059; A47B 2210/0035; A47B 88/14
USPC .......... 384/24, 18; 312/334.45, 334.8, 334.9, 312/334.11, 334.12, 334.25, 334.26, 312/334.33, 334.4, 334.5, 265.1–265.4
See application file for complete search history.

(56) References Cited

U.S. PATENT DOCUMENTS

| | | | |
|---|---|---|---|
| 3,904,254 A * | 9/1975 | Hagen et al. ..................... 384/18 |
| 4,370,007 A * | 1/1983 | Fler .......................... 312/334.11 |
| 6,379,045 B1 | 4/2002 | Cirocco |
| 6,764,151 B2 * | 7/2004 | Huang ..................... 312/334.46 |
| 6,789,862 B2 * | 9/2004 | Shih-Long et al. ...... 312/334.46 |
| 6,988,626 B2 | 1/2006 | Varghese et al. |
| 8,403,433 B2 | 3/2013 | Chen et al. |
| 8,528,999 B2 * | 9/2013 | Chen et al. ............... 312/334.45 |
| 8,562,085 B2 | 10/2013 | Chen et al. |
| 8,585,166 B2 | 11/2013 | Chen et al. |
| 2006/0078235 A1* | 4/2006 | Chen et al. ....................... 384/18 |
| 2006/0163983 A1* | 7/2006 | Wu ............................... 312/333 |
| 2007/0018547 A1* | 1/2007 | Yang et al. .................... 312/333 |
| 2012/0106880 A1* | 5/2012 | Chen et al. ....................... 384/49 |
| 2013/0039608 A1* | 2/2013 | Chen et al. ....................... 384/20 |
| 2013/0058596 A1* | 3/2013 | Chen et al. ........................ 384/7 |

* cited by examiner

*Primary Examiner* — Janet M Wilkens
*Assistant Examiner* — Hiwot Tefera
(74) *Attorney, Agent, or Firm* — Rosenberg, Klein & Lee

(57) ABSTRACT

A slide rail assembly for mounting a lateral side of a chassis to a rack includes first and second rails and a ball assembly. A sidewall of the second rail has a mounting portion to be mounted to a mounting member on the lateral side of the chassis. The ball assembly, movably mounted between the rails to facilitate relative sliding thereof, includes a ball retainer whose lateral portion corresponds in position to the space between a sidewall of the first rail and the sidewall of the second rail. The sidewall of the second rail includes a projecting block for pushing the lateral portion of the ball retainer, keeping the lateral portion close to the sidewall of the first rail.

8 Claims, 10 Drawing Sheets

SLIDE RAIL ASSEMBLY

FIELD OF THE INVENTION

The present invention relates to slide rails and more particularly to a slide rail assembly two rails of which can slide relative to each other by means of a ball assembly without the mounting member on a lateral side of a chassis colliding with one end of a lateral portion of the ball assembly due to installation errors.

BACKGROUND OF THE INVENTION

With the development of the Internet and the prevalence of personal mobile devices, the storage of electronic information or data is becoming more and more important. In particular, servers can be used to store a vast amount of such electronic information or data to meet the need of data storage. Generally speaking, a server (e.g., a rack server) is installed in a chassis, and the chassis is mounted on a rack via a pair of slide rail assemblies each composed of two or three slide rails. Thus, the installation of the server on the rack is completed.

Some slide rail assemblies in the prior art are equipped with ball retainers, each containing a plurality of balls, so that slidably connected slide rails can displace relative to one another via the balls. Such slide rail assemblies are disclosed, for example, in U.S. Pat. Nos. 6,988,626 and 6,379,045, which are referenced when the present invention was made.

As the chassis of a server is mounted and positioned on the slide rails (e.g., the inner rails) of a pair of the foregoing slide rail assemblies (i.e., those with ball retainers and balls) typically through the mounting members provided on the lateral sides of the chassis (e.g., the screws 62 in FIG. 3 and FIG. 9 of the aforesaid '626 patent), the size or specifications of the mounting members must be within predetermined allowable installation errors of the slide rail assemblies; otherwise, the mounting members on the lateral sides of the chassis of the server may bump into the ends of the ball retainers, which are located between slidably connected slide rails, when the slide rails are displaced relative to one another. Should the ball retainers be deformed as a result, the slide rails of the slide rail assemblies will have problem being displaced smoothly.

More specifically, referring to FIG. 8, a chassis (not shown) is mounted on a slide rail assembly 102 via at least one mounting member 101. The slide rail assembly 102 at least includes two slide rails (e.g., a first rail 103 and a second rail 104) and a ball retainer 105 which is disposed between the first rail 103 and the second rail 104. The ball retainer 105 is equipped with a plurality of balls 106 by means of which the first rail 103 and the second rail 104 can slide relative to each other. The chassis is mounted on the second rail 104 via the mounting member 101. When the second rail 104 is slid in a longitudinal direction relative to the first rail 103, the chassis is slid along with the second rail 104 in the longitudinal direction relative to the first rail 103 due to the mounting member 101.

Referring to FIG. 9 and FIG. 10 in conjunction with FIG. 8, when the slide rail assembly 102 mounted with the chassis (FIG. 8 to FIG. 10 showing only the mounting member 101 of the chassis) is installed on a rack, the ball retainer 105 of the slide rail assembly 102 may be deformed if the total weight of the chassis and the electronic components therein is too great. Once such deformation takes place, the lateral portion 107 of the ball retainer 105 may be tilted in a lateral direction F1 (i.e., toward the mounting member 101), as shown in FIG. 9, and when the second rail 104 is pulled in a longitudinal direction F2 relative to the first rail 103 from an initial position (see FIG. 8) to the position shown in FIG. 10, the mounting member 101 on the second rail 104 may collide with the end 108 of the lateral portion 107 of the ball retainer 105, thereby deforming the ball retainer 105 and hindering the second rail 104 from sliding relative to the first rail 103. Even worse, the slide rail assembly 102 may be damaged.

SUMMARY OF THE INVENTION

The present invention provides a slide rail assembly which has a ball assembly to facilitate relative movement of two slidably connected rails and which can prevent the mounting member on a lateral side of a chassis from colliding with one end of a lateral portion of the ball assembly during such movement.

According to one aspect of the present invention, a slide rail assembly for mounting a lateral side of a chassis to a rack is provided, wherein the lateral side of the chassis is equipped with at least one mounting member. The slide rail assembly includes a first rail, a second rail, and a ball assembly. The first rail includes an upper wall, a lower wall opposite to the upper wall, and a sidewall connected between the upper wall and the lower wall. The upper wall, the lower wall, and the sidewall of the first rail define a longitudinal channel. The second rail, which is slidably connected in the longitudinal channel of the first rail, includes an upper wall, a lower wall opposite to the upper wall, and a sidewall connected between the upper wall and the lower wall. The sidewall of the second rail has a mounting portion to be mounted to the mounting member on the lateral side of the chassis. The ball assembly includes a ball retainer and a plurality of balls arranged in the ball retainer. The ball assembly is movably mounted between the first rail and the second rail. The ball retainer includes a lateral portion corresponding in position to the space between the sidewall of the first rail and the sidewall of the second rail. The sidewall of the second rail further includes a projecting block for pushing the lateral portion of the ball retainer and thereby keeping the lateral portion of the ball retainer close to the sidewall of the first rail.

Preferably, the projecting block of the sidewall of the second rail includes an inclined surface and a pushing surface. When the second rail is pulled in a longitudinal direction relative to the first rail, the lateral portion of the ball retainer is guided by the inclined surface in order for the pushing surface to push the lateral portion of the ball retainer.

Preferably, the mounting member includes a first end portion and a second end portion opposite to the first end portion. The first end portion is connected to the lateral side of the chassis, and the second end portion is mounted at the mounting portion of the sidewall of the second rail. When mounted at the mounting portion of the sidewall of the second rail, the second end portion is located between the sidewall of the second rail and the sidewall of the first rail. There is a first distance between a wall surface of the sidewall of the second rail and a surface of the second end portion of the mounting member, and there is a second distance between the wall surface of the sidewall of the second rail and a pushing surface of the projecting block, wherein the second distance is greater than the first distance and the pushing surface is provided to push the lateral portion of the ball retainer.

Preferably, the slide rail assembly further includes a third rail. The third rail includes an upper wall, a lower wall opposite to the upper wall, and a sidewall connected between the upper wall and the lower wall. The upper wall, the lower wall, and the sidewall of the third rail define a longitudinal channel. The first rail is slidably connected in the longitudinal channel of the third rail.

According to another aspect of the present invention, a slide rail assembly includes a first rail, a second rail, and a ball assembly. The first rail includes an upper wall, a lower wall opposite to the upper wall, and a sidewall connected between the upper wall and the lower wall. The upper wall, the lower wall, and the sidewall of the first rail define a longitudinal channel. The second rail is slidably connected in the longitudinal channel of the first rail. The second rail includes an upper wall, a lower wall opposite to the upper wall, and a sidewall connected between the upper wall and the lower wall. The sidewall of the second rail has a mounting portion. The ball assembly includes a ball retainer and a plurality of balls arranged in the ball retainer. The ball assembly is movably mounted between the first rail and the second rail. The ball retainer includes a lateral portion corresponding in position to the space between the sidewall of the first rail and the sidewall of the second rail. The sidewall of the second rail further includes a projecting block for pushing the lateral portion of the ball retainer and thereby keeping the lateral portion of the ball retainer close to the sidewall of the first rail.

Preferably, the projecting block of the sidewall of the second rail includes an inclined surface and a pushing surface. When the second rail is pulled in a longitudinal direction relative to the first rail, the lateral portion of the ball retainer is guided by the inclined surface in order for the pushing surface to push the lateral portion of the ball retainer.

Preferably, the slide rail assembly further includes a third rail. The third rail includes an upper wall, a lower wall opposite to the upper wall, and a sidewall connected between the upper wall and the lower wall. The upper wall, the lower wall, and the sidewall of the third rail define a longitudinal channel. The first rail is slidably connected in the longitudinal channel of the third rail.

According to another aspect of the present invention, a slide rail assembly for mounting a lateral side of a chassis to a rack is provided, wherein the lateral side of the chassis is equipped with at least one mounting member. The slide rail assembly includes a first rail, a second rail, and a ball assembly. The first rail has a longitudinally extending main body. The second rail has a longitudinally extending main body and is slidably connected to the longitudinally extending main body of the first rail. The ball assembly includes a ball retainer and a plurality of balls arranged in the ball retainer. The ball assembly is movably mounted between the longitudinally extending main body of the first rail and the longitudinally extending main body of the second rail so that the first rail and the second rail can slide relative to each other via the balls in contact with the rails. The ball retainer includes a lateral portion corresponding in position to the space between the longitudinally extending main body of the first rail and the longitudinally extending main body of the second rail. The longitudinally extending main body of the second rail further includes a projecting block for pushing the lateral portion of the ball retainer and thereby keeping the lateral portion of the ball retainer close to the longitudinally extending main body of the first rail. The mounting member includes a first end portion and a second end portion opposite to the first end portion. The first end portion is connected to the lateral side of the chassis, and the second end portion is transversely mounted on the longitudinally extending main body of the second rail. When transversely mounted on the longitudinally extending main body of the second rail, the second end portion is located between the longitudinally extending main body of the second rail and the longitudinally extending main body of the first rail. There is a transverse first distance between a wall surface of the longitudinally extending main body of the second rail and a surface of the second end portion of the mounting member, and there is a transverse second distance between the wall surface of the longitudinally extending main body of the second rail and a pushing surface of the projecting block, wherein the second distance is greater than the first distance.

BRIEF DESCRIPTION OF THE DRAWINGS

The invention as well as a preferred mode of use and the advantages thereof will be best understood by referring to the following detailed description of some illustrative embodiments in conjunction with the accompanying drawings, wherein.

DETAILED DESCRIPTION OF THE INVENTION

Figure 1:
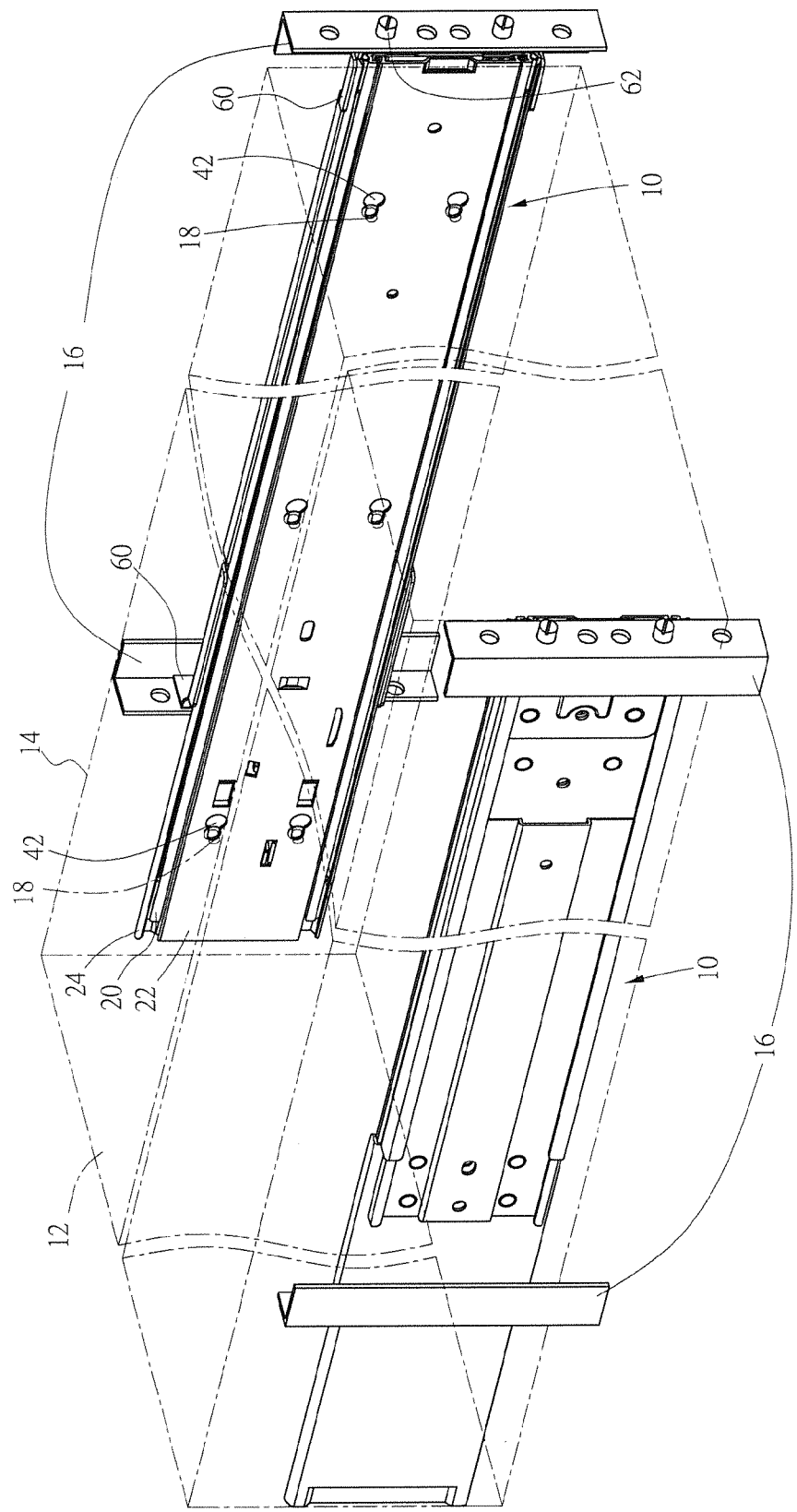
FIG. 1 schematically shows how a chassis is mounted on a rack via the slide rail assemblies in one embodiment of the present invention.

FIG. 1 shows a pair of slide rail assemblies 10 mounted on two lateral sides 14 of a chassis 12 respectively, and the chassis 12 is installed on a rack 16 via the slide rail assemblies 10. In one preferred embodiment, at least one lateral side 14 of the chassis 12 is equipped with at least one mounting member 18.

Figure 2:
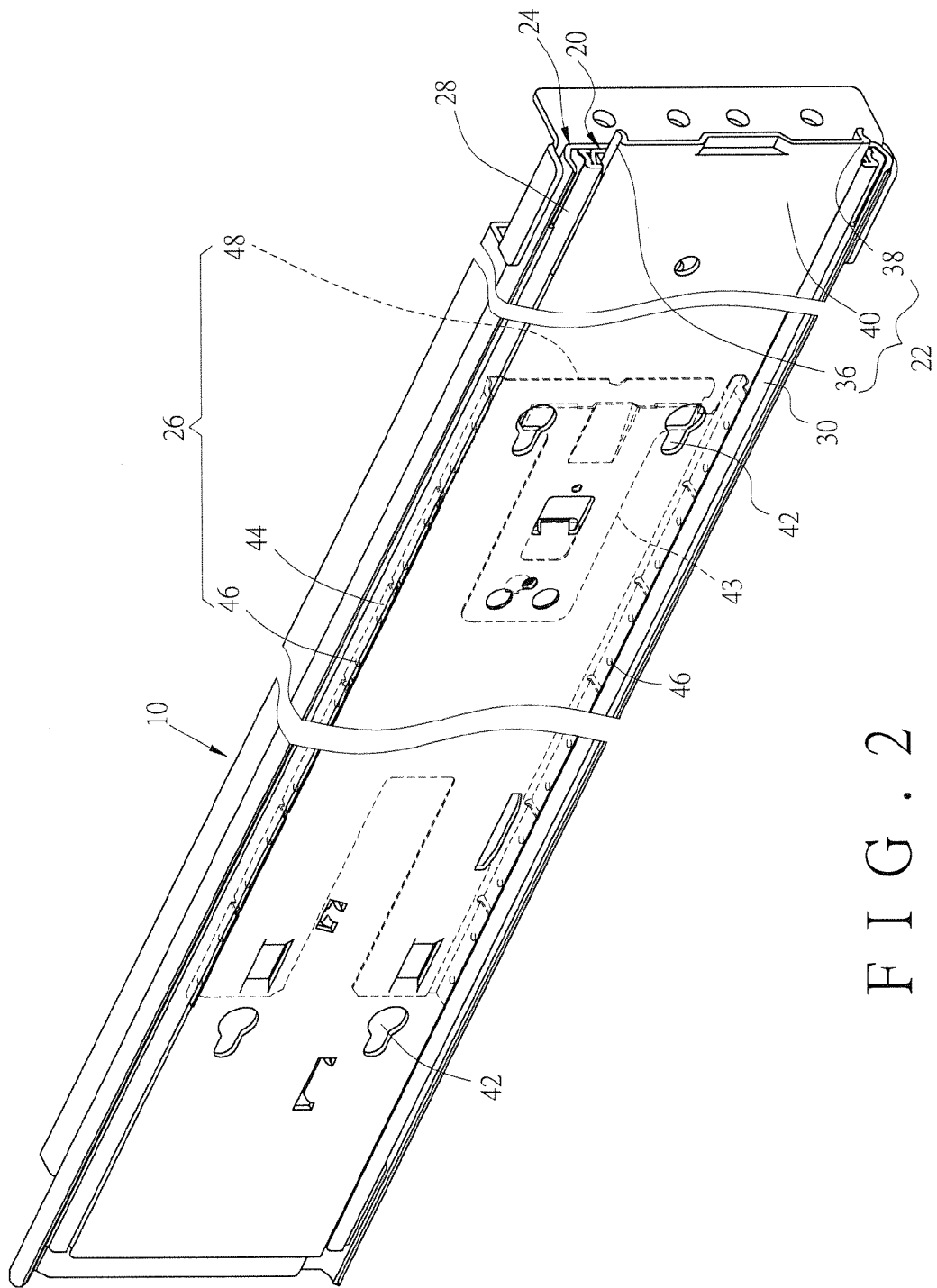
FIG. 2 is a perspective view showing how the components of the slide rail assembly in one embodiment of the present invention are arranged.

As shown in FIG. 2, the slide rail assembly 10 includes a first rail 20, a second rail 22, and a ball assembly 26. Preferably, the slide rail assembly 10 further includes a third rail 24 to complete a three-rail configuration, in which the first rail 20 serves as the middle rail, the second rail 22 as the inner rail, and the third rail 24 as the outer rail. However, the arrangement of the rails is not limited to the foregoing. Each of the first rail 20, the second rail 22, and the third rail 24 has a longitudinally extending main body.

Figure 3:
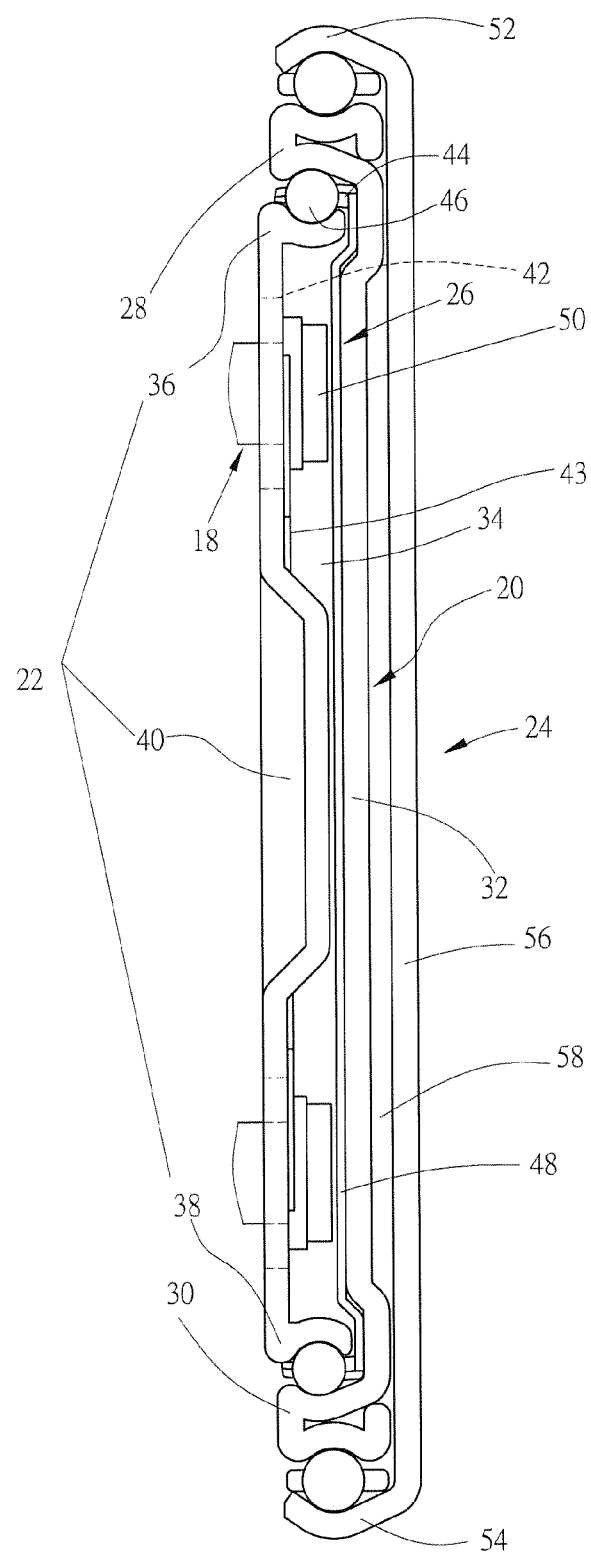
FIG. 3 is a front view of the slide rail assembly in one embodiment of the present invention.

Referring to FIG. 3, the first rail 20 includes an upper wall 28, a lower wall 30 opposite to the upper wall 28, and a sidewall 32 connected between the upper wall 28 and the lower wall 30. The upper wall 28, lower wall 30, and sidewall 32 of the first rail 20 define a longitudinal channel 34.

The second rail 22 is slidably connected in the longitudinal channel 34 of the first rail 20. The second rail 22 includes an upper wall 36, a lower wall 38 opposite to the upper wall 36, and a sidewall 40 connected between the upper wall 36 and the lower wall 38. The sidewall 40 has at least one mounting portion 42. The mounting portion 42 is configured to be mounted to the mounting member 18 on the lateral side 14 of the chassis 12 (shown in FIG. 1).

The third rail 24 includes an upper wall 52, a lower wall 54 opposite to the upper wall 52, and a sidewall 56 connected between the upper wall 52 and the lower wall 54. The upper wall 52, lower wall 54, and sidewall 56 of the third rail 24 define a longitudinal channel 58. The first rail 20 is slidably connected in the longitudinal channel 58 of the third rail 24. In addition, as shown in FIG. 1, the slide rail assembly 10 includes two brackets 60 mounted respectively at a front position and a rear position on the third rail 24. Each bracket 60 is fixed to the rack 16 via at least one fixing element 62 such that the slide rail assembly 10 is fixed to the rack 16.

The ball assembly 26 includes a ball retainer 44 and a plurality of balls 46 arranged in the ball retainer 44. The ball assembly 26 is movably mounted between the first rail 20 and the second rail 22 in such a way that the balls 46 are located between the first rail 20 and the second rail 22 to facilitate relative sliding of the first rail 20 and the second rail 22. The ball retainer 44 includes a lateral portion 48 corresponding in position to the space between the sidewall 32 of the first rail 20 and the sidewall 40 of the second rail 22.

Figure 4:
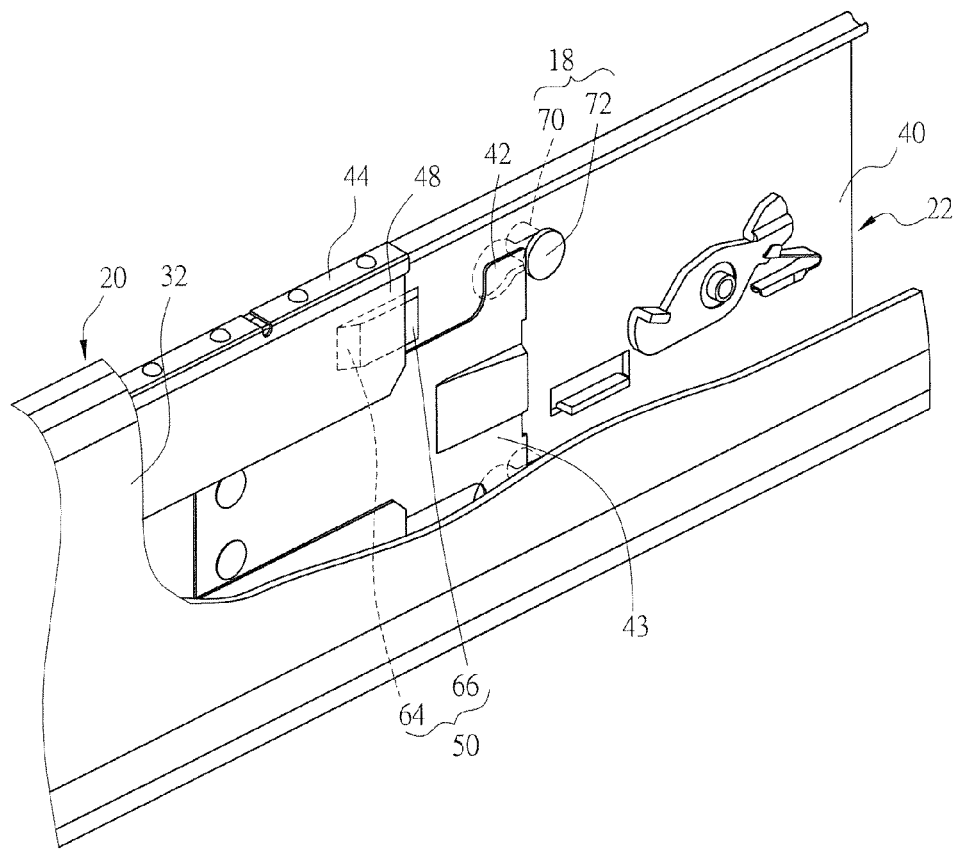
FIG. 4 is a perspective view showing in particular the projecting block on a sidewall of the second rail in the slide rail assembly in one embodiment of the present invention.

As shown in FIG. 4, the sidewall 40 of the second rail 22 further includes a projecting block 50. The projecting block 50 is configured to push the lateral portion 48 of the ball retainer 44, thereby keeping the lateral portion 48 of the ball retainer 44 close to the sidewall 32 of the first rail 20. The projecting block 50 preferably includes an inclined surface 64 and a pushing surface 66.

More specifically, the mounting member 18 on the lateral side 14 of the chassis 12 (shown in FIG. 1) is mounted at the mounting portion 42 of the sidewall 40 of the second rail 22. In addition, a block member 43 is mounted on the sidewall 40 of the second rail 22. After the mounting member 18 is mounted at the mounting portion 42 of the sidewall 40 of the second rail 22, the block member 43 is pressed against the mounting member 18, allowing the chassis 12 to be connected and fixed to the second rail 22 of the slide rail assembly 10. The slide rail assembly 10 mounted with the chassis 12 is then positioned on the rack 16 via the brackets 60 on the third rail 24, as shown in FIG. 1.

Figure 5:
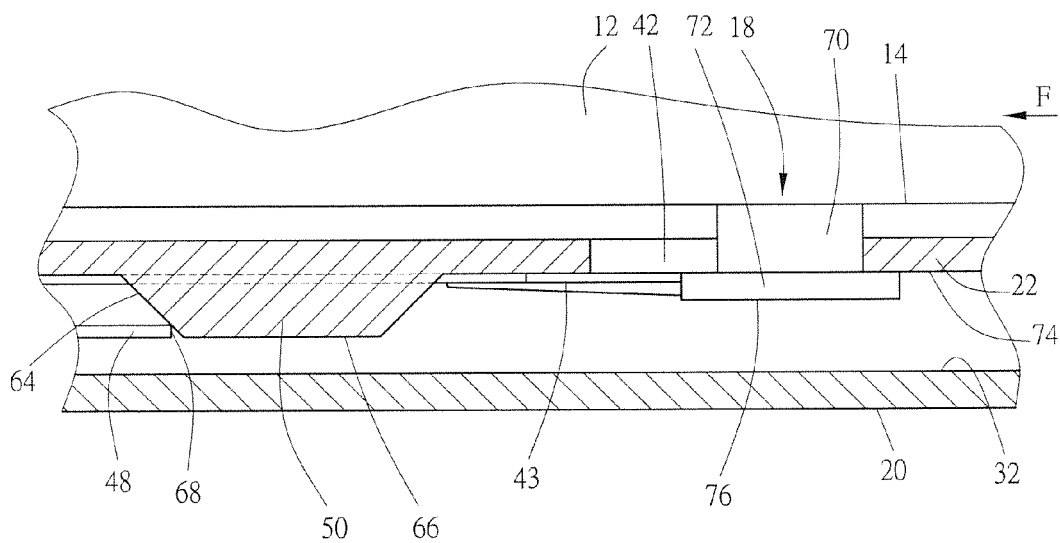
FIG. 5 is a schematic drawing showing how the second rail in the slide rail assembly in one embodiment of the present invention is slid relative to the first rail.
Figure 6:
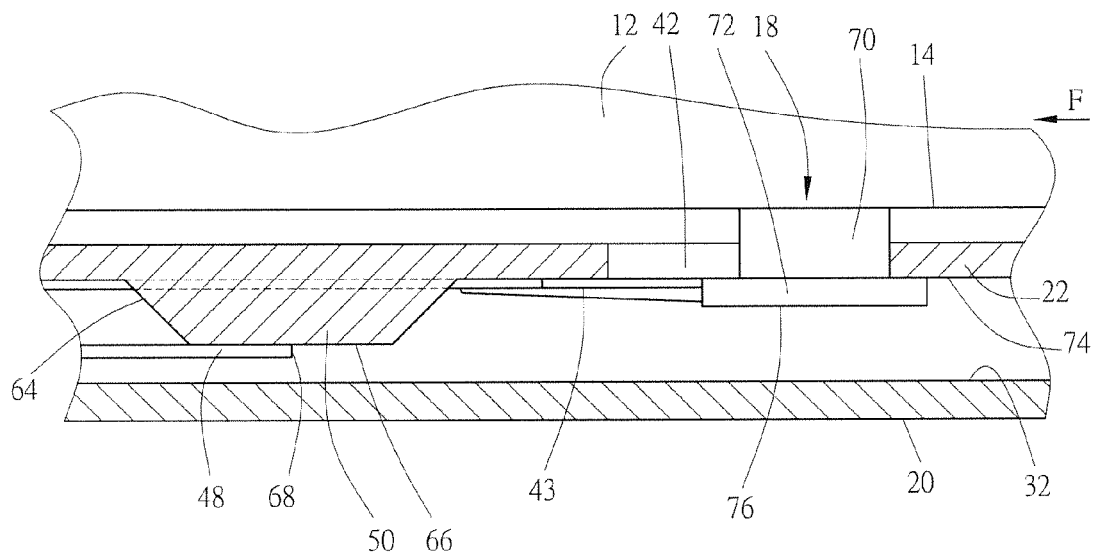
FIG. 6 is another schematic drawing showing how the second rail in the slide rail assembly in one embodiment of the present invention is slid relative to the first rail.
Figure 7:
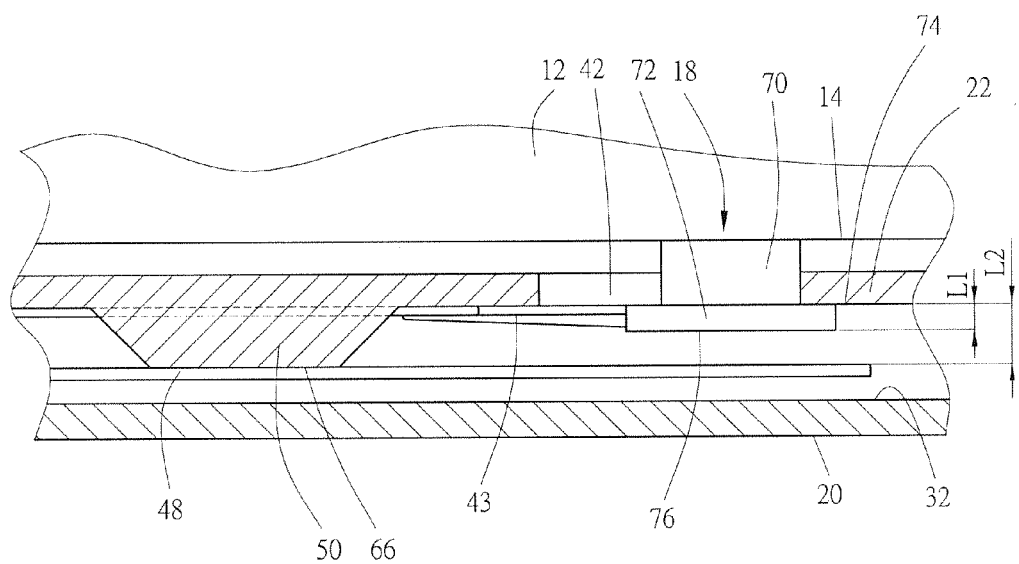
FIG. 7 is yet another schematic drawing showing how the second rail in the slide rail assembly in one embodiment of the present invention is slid relative to the first rail.
Figure 8:
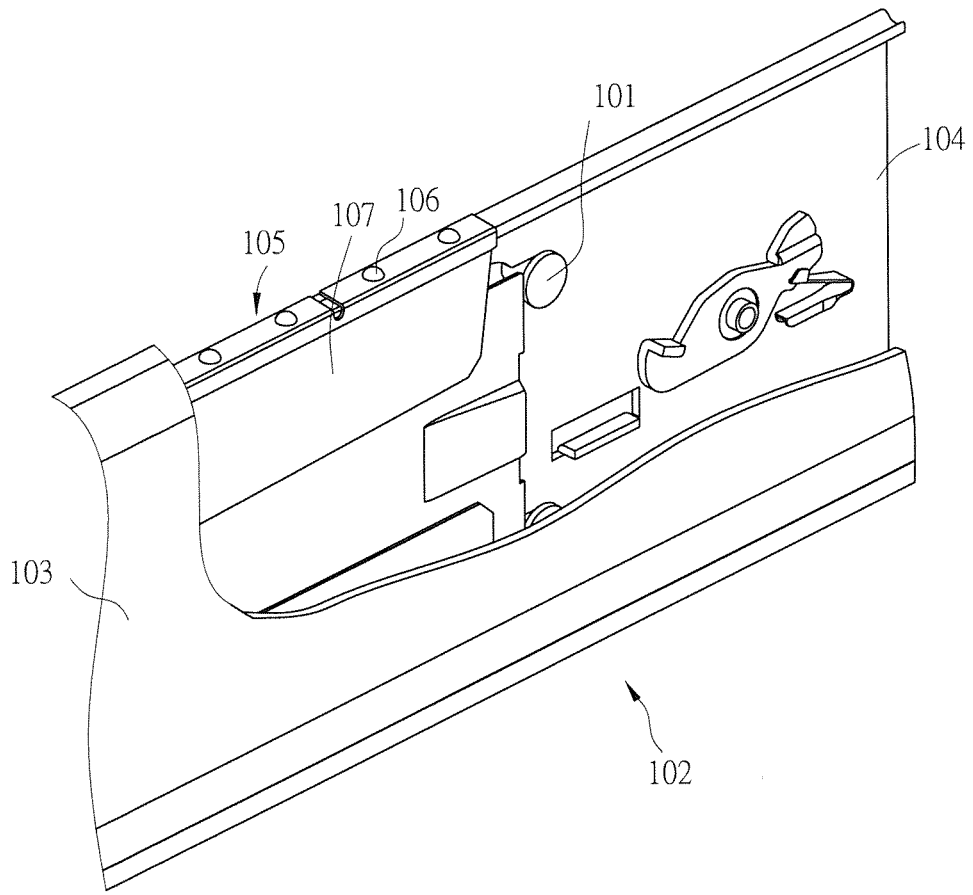
FIG. 8 is a perspective view showing how a chassis is mounted on a prior art slide rail assembly via a mounting member.
Figure 9:
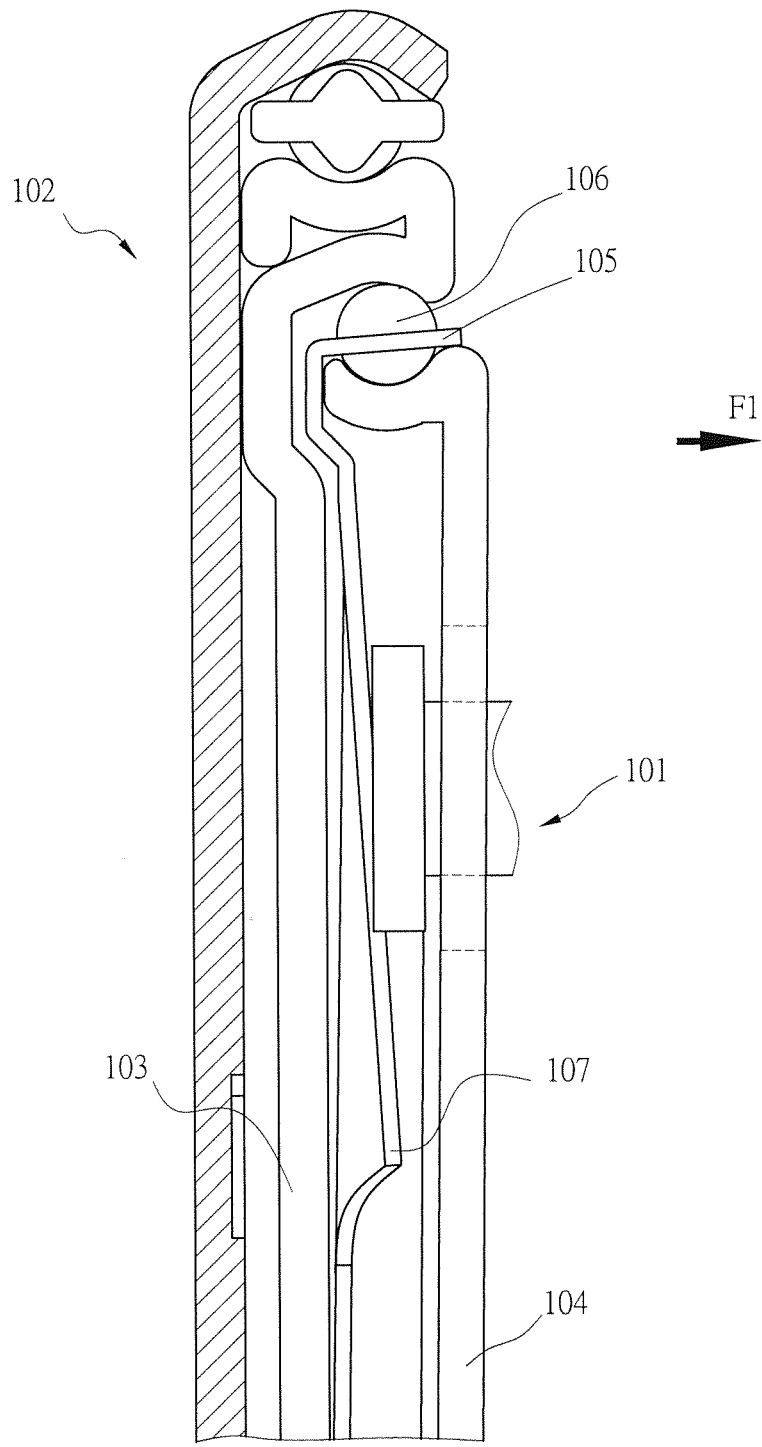
FIG. 9 schematically shows how a mounting member collides with a ball retainer in the prior art.
Figure 10:
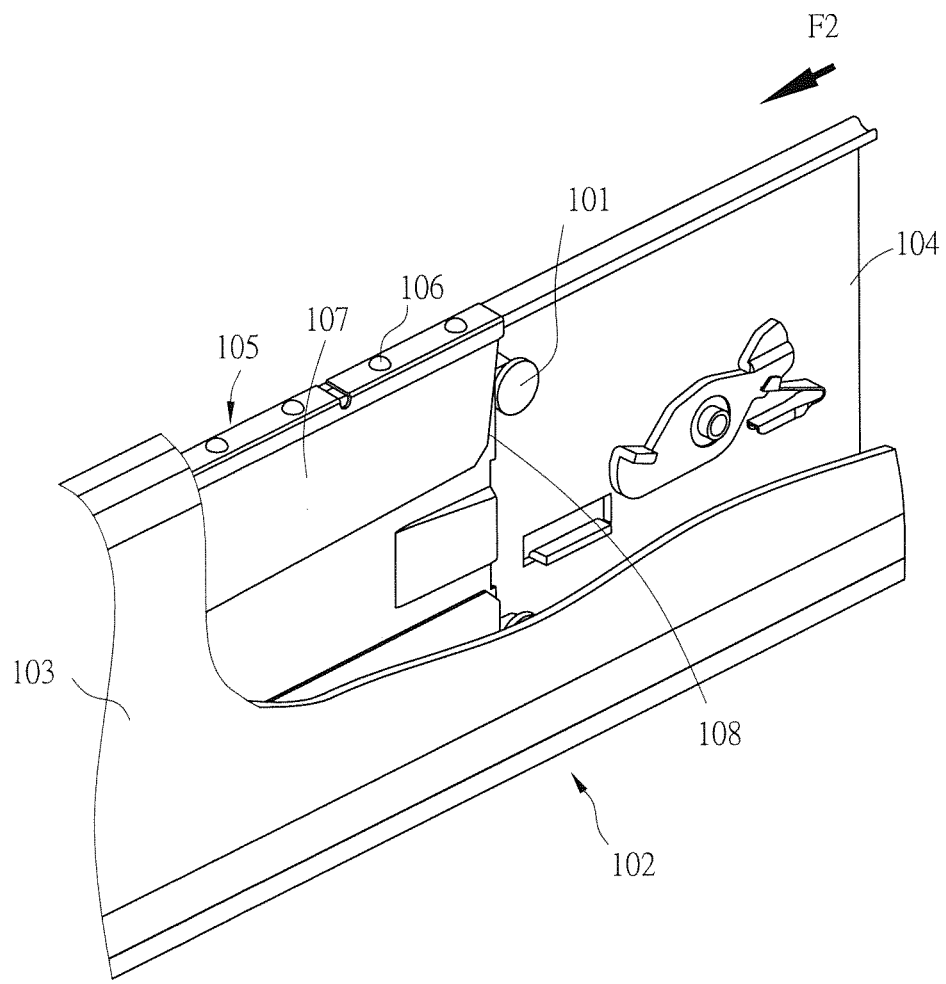
FIG. 10 is a perspective view showing how a mounting member collides with a ball retainer in the prior art when being displaced.

Referring to FIG. 5, FIG. 6, and FIG. 7, when the second rail 22 mounted with the chassis 12 is pulled in a longitudinal direction F relative to the first rail 20, the lateral portion 48 of the ball retainer 44 is guided by the inclined surface 64 of the projecting block 50 in order for the pushing surface 66 of the projecting block 50 to push the lateral portion 48 of the ball retainer 44, keeping the lateral portion 48 of the ball retainer 44 close to the sidewall 32 of the first rail 20. Therefore, when the second rail 22 is displaced in the longitudinal direction F (see FIG. 5), the mounting member 18 will not collide with the end 68 of the lateral portion 48 of the ball retainer 44, even if the size issue happens or the lateral portion 48 of the ball retainer 44 is tilted by the weight of the chassis 12. The ball retainer 44 is thus protected from deformation. In this way, the slide rails (e.g., the first rail 20 and the second rail 22) of the slide rail assembly 10 are able to slide smoothly relative to each other.

The mounting member 18 includes a first end portion 70 and a second end portion 72 opposite to the first end portion 70. The first end portion 70 is connected to the lateral side 14 of the chassis 12. The second end portion 72 is transversely mounted at the mounting portion 42 of the sidewall 40 of the second rail 22. The first end portion 70 and the second end portion 72 may be cylindrical, and the second end portion 72 is greater in diameter than the first end portion 70. However, the configurations of the first end portion 70 and the second end portion 72 are not limited to the above.

When transversely mounted at the mounting portion 42 of the sidewall 40 of the second rail 22, the second end portion 72 is restricted at the mounting portion 42 by the block member 43. There is a transverse first distance L1 between a wall surface 74 of the sidewall 40 of the second rail 22 (i.e., the wall surface facing the first rail 20) and a surface 76 of the second end portion 72 of the mounting member 18. There is a transverse second distance L2 between the wall surface 74 of the sidewall 40 of the second rail 22 and the pushing surface 66 of the projecting block 50. The second distance L2 is greater than the first distance L1.

Thus, when the second rail 22 is slid in the longitudinal direction F (see FIGS. 5 and 6), the mounting member 18 is not able to collide with the end 68 of the lateral portion 48 of the ball retainer 44. As such, the ball retainer 44 is protected from deformation, and the slide rails (e.g., the first rail 20 and the second rail 22) of the slide rail assembly 10 thus are able to slide smoothly relative to each other.

While the present invention has been disclosed through the preferred embodiments described above, the embodiments are not intended to limit the scope of the present invention. The scope of the present invention is defined only by the appended claims.

The invention claimed is:

1. A slide rail assembly for mounting a lateral side of a chassis to a rack, the slide rail assembly comprising:
   a first rail including an upper wall, a lower wall opposite to the upper wall, and a sidewall connected between the upper wall and the lower wall, wherein the upper wall, the lower wall, and the sidewall define a longitudinal channel;
   a second rail slidably connected to the first rail, the second rail including an upper wall, a lower wall opposite to the upper wall, and a sidewall connected between the upper wall and the lower wall, the sidewall of the second rail having a mounting portion to engage a mounting member formed on the lateral side of the chassis; and
   a ball assembly including a ball retainer and a plurality of balls arranged in the ball retainer, the ball assembly being movably mounted between the first rail and the second rail, the ball retainer having a lateral portion extending into a space between the sidewall of the first rail and the sidewall of the second rail;
   wherein a projecting block protrudes from a surface along the sidewall of the second rail into the longitudinal channel to remain spaced from the sidewall of the first rail, the projecting block being fixedly disposed relative to the mounting portion longitudinally offset therefrom, the projecting block defining a ramped structure, and
   wherein the projecting block, upon contact with the lateral portion of the ball retainer during a longitudinal movement of the ball retainer relative to the projecting block, pushes the lateral portion of the ball retainer away from the sidewall of the second rail, thereby maintaining a clearance between the lateral portion of the ball retainer and the surface along the sidewall of the second rail for the duration of the longitudinal movement beyond the projecting block.

2. The slide rail assembly of claim 1, wherein the projecting block of the second rail includes an inclined surface and a pushing surface, and when the second rail is moved in a longitudinal direction relative to the first rail, the lateral portion of the ball retainer is guided by the inclined surface in order for the pushing surface to push the lateral portion of the ball retainer.

3. The slide rail assembly of claim 1,
wherein the mounting portion is configured to retentively receive the mounting member,
wherein the mounting member is formed with a first end portion and a second end portion opposite to the first end portion, the first end portion being connected to the lateral side of the chassis, the second end portion being mounted at the mounting portion of the sidewall of the second rail, the second end portion being located between the sidewall of the second rail and the sidewall of the first rail when mounted at the mounting portion of the sidewall of the second rail,
wherein the projecting block pushes the lateral portion of the ball retainer with a pushing surface, and
wherein there is a first distance between the surface along the sidewall of the second rail and a surface of the second end portion of the mounting member, and there is a second distance between the surface along the sidewall of the second rail and the pushing surface of the projecting block, the second distance being greater than the first distance.

4. The slide rail assembly of claim 1, further including a third rail, the third rail having an upper wall, a lower wall opposite to the upper wall, and a sidewall connected between the upper wall and the lower wall, wherein the upper wall, the lower wall, and the sidewall of the third rail define a longitudinal channel, the first rail being slidably connected to the third rail.

5. A slide rail assembly comprising:
a first rail including an upper wall, a lower wall opposite to the upper wall, and a sidewall connected between the upper wall and the lower wall, wherein the upper wall, the lower wall, and the sidewall define a longitudinal channel;
a second rail slidably connected to the first rail, the second rail including an upper wall, a lower wall opposite to the upper wall, and a sidewall connected between the upper wall and the lower wall, the sidewall of the second rail having a mounting portion to engage a mounting member formed on a lateral side of a chassis; and
a ball assembly including a ball retainer and a plurality of balls arranged in the ball retainer, the ball assembly being movably mounted between the first rail and the second rail, the ball retainer having a lateral portion extending into a space between the sidewall of the first rail and the sidewall of the second rail;
wherein a projecting block protrudes from a surface along the sidewall of the second rail into the longitudinal channel to remain spaced from the sidewall of the first rail, the projecting block being fixedly disposed relative to the mounting portion longitudinally offset therefrom, the projecting block defining a ramped structure, and
wherein the projecting block, upon contact with the lateral portion of the ball retainer during a longitudinal movement of the ball retainer relative to the projecting block, pushes the lateral portion of the ball retainer away from the sidewall of the second rail, thereby maintaining a clearance between the lateral portion of the ball retainer and the surface along the sidewall of the second rail for the duration of the longitudinal movement beyond the projecting block.

6. The slide rail assembly of claim 5, wherein the projecting block of the sidewall of the second rail includes an inclined surface and a pushing surface, and when the second rail is moved in a longitudinal direction relative to the first rail, the lateral portion of the ball retainer is guided by the inclined surface in order for the pushing surface to push the lateral portion of the ball retainer.

7. The slide rail assembly of claim 5, further including a third rail, the third rail having an upper wall, a lower wall opposite to the upper wall, and a sidewall connected between the upper wall and the lower wall, wherein the upper wall, the lower wall, and the sidewall of the third rail define a longitudinal channel, the first rail being slidably connected to the third rail.

8. A slide rail assembly for mounting a lateral side of a chassis to a rack, the slide rail assembly comprising:
a first rail having a longitudinally extending main body;
a second rail having a longitudinally extending main body and slidably connected to the first rail, the longitudinally extending main body of the second rail having a mounting portion to engage a mounting member formed on the lateral side of the chassis; and
a ball assembly including a ball retainer and a plurality of balls arranged in the ball retainer, the ball assembly being movably mounted between the first rail and the second rail, the ball retainer having a lateral portion extending into a space between the longitudinally extending main body of the first rail and the longitudinally extending main body of the second rail;
wherein a projecting block protrudes from a surface along the longitudinally extending main body of the second rail into the space between the longitudinally extending main bodies of the first and second rails to remain spaced from the longitudinally extending main body of the first rail, the projecting block being fixedly disposed relative to the mounting portion longitudinally offset therefrom, the projecting block defining a ramped structure,
wherein the projecting block, upon contact with the lateral portion of the ball retainer during a longitudinal movement of the ball retainer relative to the projecting block, pushes the lateral portion of the ball retainer away from the sidewall of the second rail, thereby maintaining a clearance between the lateral portion of the ball retainer and the surface along the sidewall of the second rail for the duration of the longitudinal movement beyond the projecting block,
wherein the mounting portion is configured to retentively receive the mounting member,
wherein the mounting member is formed with a first end portion and a second end portion opposite to the first end portion, the first end portion being connected to the lateral side of the chassis, the second end portion being transversely mounted at the mounting portion formed on the longitudinally extending main body of the second rail, the second end portion being located between the longitudinally extending main body of the second rail and the longitudinally extending main body of the first rail when transversely mounted at the mounting portion formed on the longitudinally extending main body of the second rail, and
wherein there is a transverse first distance between the surface along the longitudinally extending main body of the second rail and a surface of the second end portion of the mounting member, and there is a transverse second distance between the surface along the longitudinally extending main body of the second rail and a pushing surface of the projecting block, the second distance being greater than the first distance.

* * * * *